(12) United States Patent
Scranton et al.

(10) Patent No.: US 6,502,591 B1
(45) Date of Patent: Jan. 7, 2003

(54) SURFACE TENSION EFFECT DRYER WITH POROUS VESSEL WALLS

(75) Inventors: Dana Scranton, Kalispell, MT (US); Ian Sharp, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 4 days.

(21) Appl. No.: 09/590,724

(22) Filed: Jun. 8, 2000

(51) Int. Cl.$^7$ ................................................. B08B 3/06
(52) U.S. Cl. ........................ 134/902; 134/110; 134/155; 134/186
(58) Field of Search .................... 134/1.3, 26, 30, 134/31, 34, 36, 37, 110, 111, 155, 186, 184, 902

(56) References Cited

U.S. PATENT DOCUMENTS

| | | | | |
|---|---|---|---|---|
| 353,849 | A | * 12/1886 | Entrekin ..................... 134/151 |
| 3,456,659 | A | * 7/1969 | Tiby ........................... 134/153 |
| 3,543,776 | A | * 12/1970 | Layton ....................... 134/182 |
| 4,361,163 | A | * 11/1982 | Aigo ........................... 134/199 |
| 4,771,615 | A | * 9/1988 | Fukuzawa et al. ....... 210/380.2 |
| 5,069,235 | A | * 12/1991 | Vetter et al. ................ 134/113 |
| 5,656,097 | A |   8/1997 | Olesen et al. ................ 134/1 |
| 5,743,280 | A | * 4/1998 | Han .......................... 134/56 R |
| 5,820,688 | A | * 10/1998 | Koppl et al. ................ 134/902 |
| 5,849,091 | A |   12/1998 | Skrovan et al. |
| 6,132,523 | A |   10/2000 | Okuda et al. |
| 6,273,107 | B1 | * 8/2001 | Adams et al. ........... 134/102.1 |

* cited by examiner

Primary Examiner—Randy Gulakowski
Assistant Examiner—Saeed Chaudhry
(74) Attorney, Agent, or Firm—Perkins Coie LLP

(57) ABSTRACT

A processor for rinsing and drying of semiconductor substrates includes a process vessel contained within an outer containment vessel. A diluted organic vapor creates a Marangoni effect flow along the surface of processing liquid contained within the process vessel. The process vessel includes porous walls that allow residual chemicals, organic species, and other unwanted materials to flow from the process vessel to the outer containment vessel. The porous walls allow for the maintenance of a stable surface tension gradient to sustain a consistent Marangoni force for even drying. Replacement processing fluid is preferably introduced to the process vessel to prevent the build up of organic species in the surface layer of the processing fluid.

29 Claims, 3 Drawing Sheets

SURFACE TENSION EFFECT DRYER WITH POROUS VESSEL WALLS

FIELD OF THE INVENTION

The field of the invention is rinsing and drying of semiconductor substrates. More specifically, the invention relates to methods and devices for drying semiconductor substrates using a surface tension effects.

BACKGROUND OF THE INVENTION

During the processing of semiconductor substrates into electronic devices, such as integrated circuits, it is necessary to rinse and dry the semiconductor substrates. The rinsing process removes residual chemicals, particulate matter, and contaminants from the semiconductor substrates. Chemical residues and contaminants that are not removed during the rinsing and drying steps reduce the overall yield of the manufacturing process. This reduces the number of usable electronic components, such as integrated circuits, microprocessors, memory devices, etc., that can be obtained from a semiconductor substrate. Contamination problems are particularly troublesome in current semiconductor processes where an increasing, number of ever smaller electronic devices are formed on a semiconductor substrate. As semiconductor manufacturing technology advances, the electronic devices formed on the substrates have become progressively smaller, so that more devices are fit onto the substrate, to provide ever more sophisticated, versatile, and economic electronic end products. However, as a result, contamination becomes even more difficult to control, as even smaller particles can act as contaminants. Consequently, ever smaller particles must be removed or excluded. As avoiding contamination caused by smaller particles is more difficult than avoiding contamination by larger particles, rinsing and drying semiconductor substrates now presents additional design challenges.

To reduce contamination, various surface tension effect techniques have been used. Two of the most widely used are thermocapillary and solutocapillary techniques. U.S. Pat. No. 4,722,752 (Steck) teaches that the use of warm or hot water, with the subsequent reduction in surface tension, can aid in the drying of a semiconductor wafer through a combination of evaporation and low surface tension.

U.S. Pat. Nos. 4,911,761 (McConnell et al.), 5,271,774 (Leenaars et al.), 5,807,439 (Akatsu et al.), and 5,571,337 (Mohindra et al.), and European Patent Specification No. 0 385 536 B1. (Lenaars et al.). describe solutocapillary techniques McConnell et al. uses a relatively thick layer of an organic solvent such as isopropyl alcohol (IPA) on the surface of a liquid such as water, within a closed and preferably heated process vessel. The layer of solvent is then allowed to recede over the semiconductor wafers. The organic solvent creates a displacement of the water on the liquid surface, effectively diluting the water near the surface. This reduces the surface tension of the surface region, causing displacement of water on the wafer surface by the organic solvent.

Mohindra et al. teaches that draining water slowly over the surface of a semiconductor wafer while simultaneously introducing IPA in dilute form causes a lowering of the surface tension of the surface region of the water. The reduced surface tension located adjacent to the face of the semiconductor wafer promotes the removal of water from the work piece. The Mohindra et al. apparatus dries the wafers without substantial movement of the wafers. However, non-uniform drying (from the top of the wafer to the bottom) may result due to an accumulation of contaminants at the surface layer of the water. Since the liquid at the surface is unable to cascade once the water first starts to recede, an increasing concentration of contaminants builds near the surface layer as the water level decreases. The accumulation of contaminants, and particularly organic contaminants, alters the surface tension gradient as a function of time and position along the face of the semiconductor wafer.

Lenaars et al. describes the introduction of an organic solvent, such as IPA, in the presence of a continuously refreshed surface layer of water while simultaneously moving the wafers through the liquid-gas interface. A Marangoni effect flow is produced, creating a region of low surface tension directly adjacent to the semiconductor wafer surface. As is well known in the field, the Marangoni effect produces a flow of liquid from the region of low surface tension to a region of high surface tension.

In McConnell et al. and Mohindra et al., the semiconductor wafers are held in a stationary position during the rinsing and drying steps. In Mohindra et al., the water in the process vessel is drained over the wafers, which produces an inconsistent and constantly changing surface tension from the top of the work piece to the bottom. In McConnell, there is less inconsistency. However, there is still non-uniform surface tension, because the layer of IPA on the surface of the water changes from the top of the vessel to the bottom of the vessel.

In Lenaars et al., this phenomena is reduced by maintaining an overflow of the water at the surface, while introducing an organic vapor continuously during the drying phase. However, movement of the semiconductor wafers during processing is required. Having to move the wafers is disadvantageous because additional components are required, adding to the mechanical complexity, and reducing the reliability of the apparatus. In addition, the movement increases the risk of damage to the wafers during transfer into and out of the liquid.

Accordingly, there is a need for a apparatus and method for rinsing and drying semiconductor substrates that: (1) efficiently removes residual chemicals, particulate matter, organic species, and contaminants from semiconductor substrates; (2) does not produce a gradient of trapped organic species as measured from the top to the bottom of the semiconductor substrate; (3) removes water and contaminants from the surface of the semiconductor substrates; and (4) does not move the semiconductor substrates during rinsing/drying operations.

SUMMARY OF THE INVENTION

In a first aspect of the invention, a processor for rinsing and drying semiconductor substrates is disclosed. The processor includes an outer containment vessel that holds an inner process vessel. One or more semiconductor substrates are loaded within the process vessel. The semiconductor substrates are held stationary within the process vessel. The process vessel includes porous walls which permit the transfer of fluid from the process vessel to the outer containment vessel.

In a second separate aspect of the invention, in a method for rinsing and drying a semiconductor substrate, a processing fluid is introduced into a process vessel. The processing fluid bathes a stationary semiconductor substrate in the process vessel. A dilute organic vapor is introduced above the processing fluid in the process vessel. The processing fluid is evacuated from the process vessel to expose the semiconductor substrate. A lateral Marangoni effect flow is produced on the surface region of the processing fluid contained within the process vessel. The flow originates from the semiconductor substrate and travels across the processing fluid surface region and through a porous wall of the process vessel, into an outer containment vessel. The invention resides in subcombinations of the foregoing features as well.

These aspects provide for a constant uniform concentration gradient of organic liquid on the surface of a processing fluid where a meniscus comes into contact with a semiconductor substrate, while keeping the semiconductor substrate stationary during processing.

It is an object of the invention to provide an improved method and apparatus for rinsing and drying a workpiece.

DETAILED DESCRIPTION OF THE PREFERRED EMBODIMENTS

Figure 1:
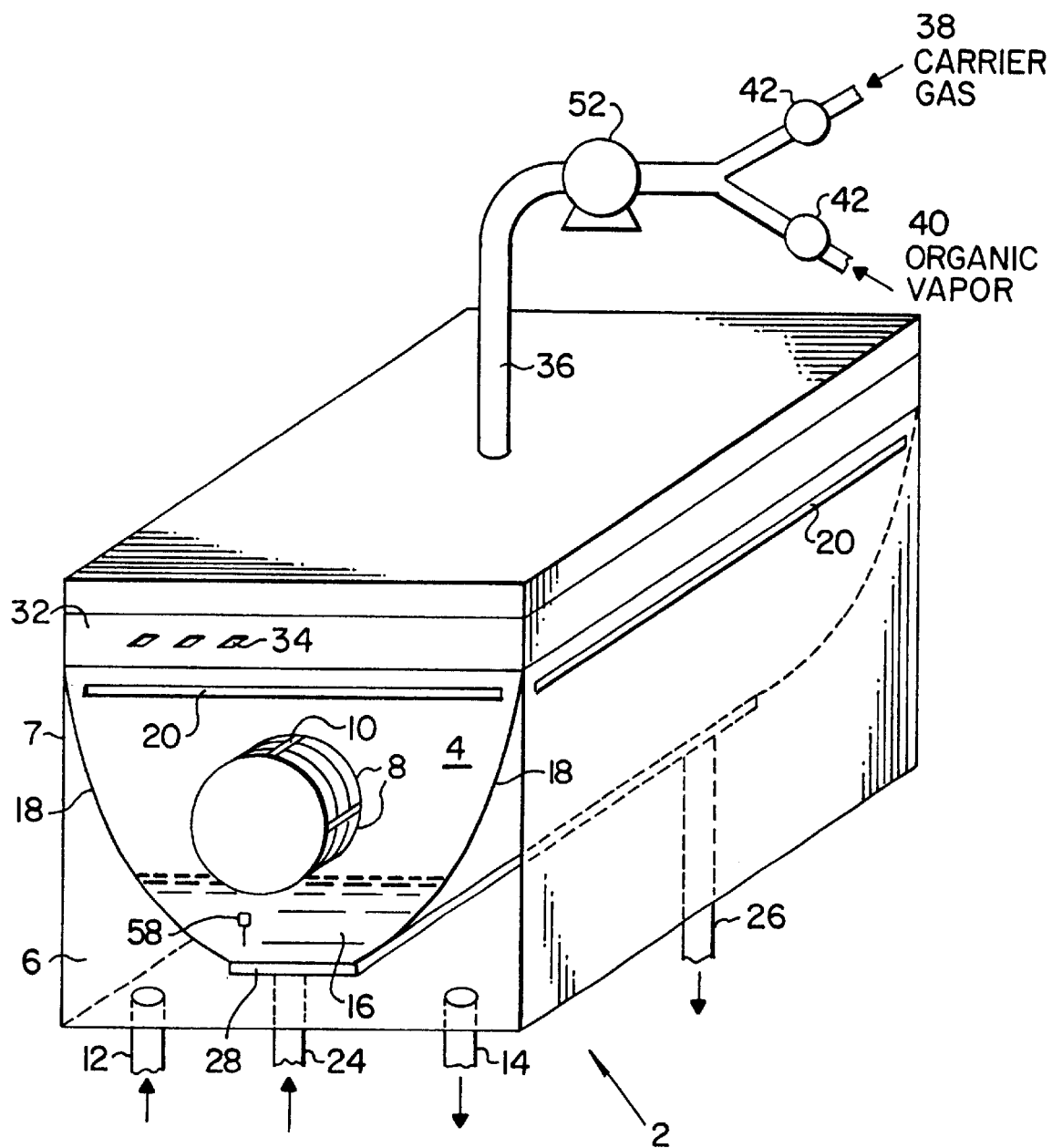
FIG. 1 is a perspective view of the rinser/dryer processor.

Referring now to the drawings, and particularly to FIG. 1, a processor 2 includes a process vessel 4 and an outer containment vessel 6. The processor 2 is used as a rinser/dryer for the processing of semiconductor substrates 8. The term semiconductor substrate or wafer 8 herein includes such work pieces as flat panel displays, semiconductor wafers, photomasks, optical and memory disks, and similar flat media. The processor 2 is adapted to rinse/dry one or more semiconductor substrates 8. Preferably, the semiconductor substrates 8 are held within a cassette or holder 10 positioned within the process vessel 4. The cassette 10 preferably contacts each semiconductor substrate 8 in a minimum number of locations to minimize potential contamination. The cassette 10 and one or more semiconductor substrates 8 are held stationary during the rinsing/drying process. Therefore, no complex mechanical lifting device is needed.

The outer containment vessel 6 has an inlet 12 and outlet 14. The inlet 12 and outlet 14 permit processing fluid 16 such as deionized (Dl) water to enter and exit the outer containment vessel 6. With the exception of the inlet 12 and outlet 14, the outer containment vessel 6 is fluid-tight.

Figure 2:
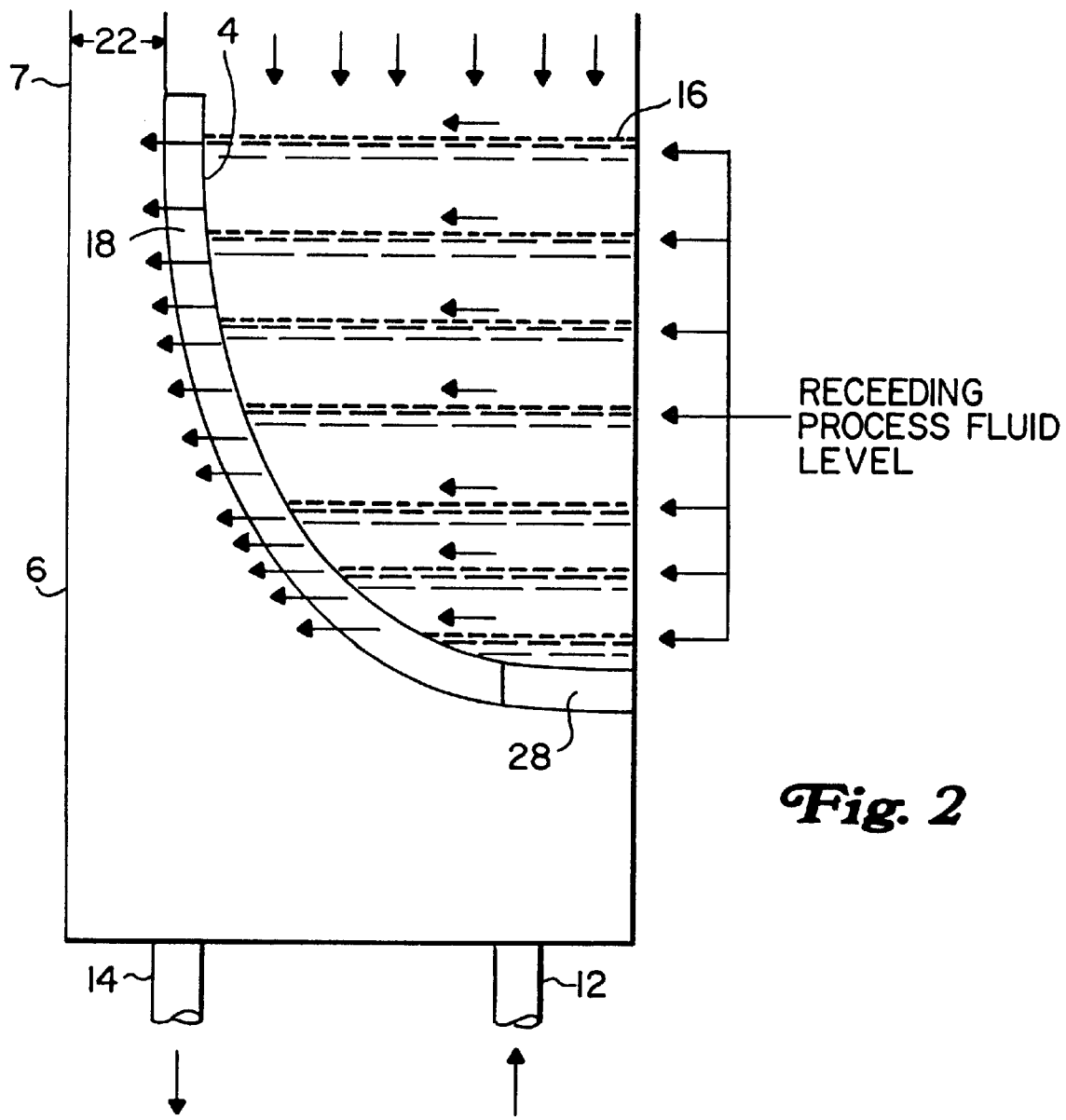
FIG. 2 is a section view of an alternative embodiment.

The process vessel 4, located inside the outer containment vessel 6, is preferably parabolic in shape, as shown in FIGS. 1 and 2. Other shapes, however, may be used. In the embodiment shown in FIG. 1, the walls 18 of the process vessel 4 join the upper sidewall of the outer continent vessel 6. Slot drains 20 are provided at the upper side walls 7, so that processing fluid 16 may cascade out of the process vessel 4 and into the containment vessel 6.

In another embodiment, as shown in FIG. 2, a gap 22 is provided between the outer containment vessel 6 and the upper sidewalls 7 of the process vessel 4. In this embodiment, there are no slot drains.

The process vessel 4 preferably includes an inlet 24 and outlet 26. The level of processing fluid 16 within the process vessel 4 can be controlled by varying the flow rates through the inlet 24 and outlet 26. Preferably, a diffuser 28 is located at the bottom of the process vessel 4. The diffuser 28 aids in producing laminar flow of the processing fluid 16 upwardly within the process vessel 4.

The process vessel 4 advantageously has walls 18 made of porous material. Preferably, the porous walls 18 have a substantially uniform thickness. The porous walls 18 assist in removing residual chemicals, particulate matter, contaminants, organic species, and water from the semiconductor substrates 8. The porous walls 18 are preferably formed of a fluropolymer having a pre-determined porosity.

Capillary forces across the walls 18, resulting from the porosity, create a surface tension induced flow from one side of the wall 18 to the other side. The porous walls 18 allow the maintenance of a stable surface tension gradient; thereby producing a consistent Marangoni force during drying.

A gas diffuser 32 is located above the process vessel 4. The gas diffuser 32 advantageously includes a plurality of orifices 34 to permit gas to flow from above and into the processor 2. While the orifices 34 can be of any shape, rectangular-shaped orifices 34 are preferred.

One or more gas delivery pipes 36 are connected to the gas diffuser 32 to supply a carrier gas 38 and an organic vapor 40. The carrier gas 38 and organic vapor 40 are preferably pre-mixed prior to entry into the diffuser 32. The gas delivery pipe 36 is connected to separate sources for the carrier gas 38 and the organic vapor 40. The carrier gas 38 is preferably $N_2$, but other inert gases can also be used. The organic vapor 40 is preferably isopropyl alcohol (IPA). Of course, other materials may be used to produce Marangoni effects. The dilution of the combined carrier gas 38 and organic vapor 40 is preferably controlled with pressure regulators 42.

In a preferred method, a cassette 10 containing a plurality of semiconductor substrates or articles 8 is loaded into the processor 2. To rinse the articles, a processing fluid 16 such as Dl water is introduced into the process vessel 4, and the outer 20 containment vessel 6 via inlets 12, 24. The Dl water level rises up from bottom along the walls 18. Preferably, the vessel is level so that the Dl water level on each side of the walls 18 is the same. In this way, the transport of Dl water or other materials across the walls 18 is initially inhibited, during the rinse.

After the semiconductor substrates 8 have been rinsed adequately with Dl water, the carrier gas 38 and organic vapor gas 40 are introduced to the process vessel 4 via the gas diffuser 32. A diluted organic vapor is thus created over the surface of the Dl water 16 within the process vessel 4. Molecules of the organic vapor are absorbed into the surface layer of the Dl water 16. Preferably, the carrier gas 38 and organic vapor gas 40 are continuously delivered to the process vessel 4 during the rinsing process, to replenish the absorbed organic vapor molecules on the surface of the water 16.

Next, the Dl water 16 within the process vessel 4 and outer containment vessel 6 is evacuated from the two chambers via outlets 14, 26. The DI water 16 level on both sides of walls 18 thus begins to recede.

Figure 3:
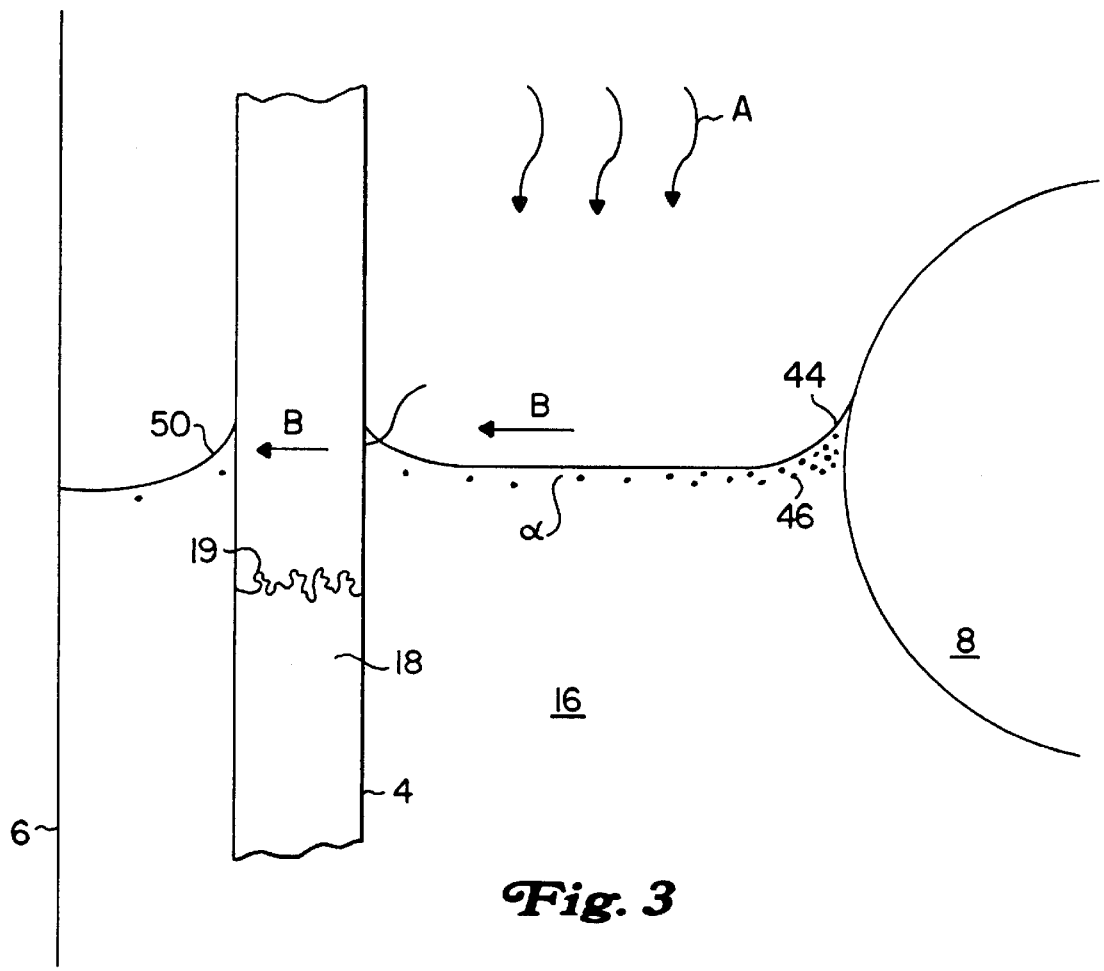
FIG. 3 illustrates schematically the Marangoni effect flow produced according to the invention.

As shown in FIG. 3, menisci 48, 50 form on either side of the wall 18. Preferably, DI water 16 is released from the process vessel 4 and outer containment vessel 6 at a rate such that the two falling menisci 48, 50 of liquid on either side of the wall 18 are at substantially the same level or height during release of the water 16. This further aids in creating spontaneous flow of liquid from low surface tension side located in the process vessel 4 (induced by the organic vapor) to the higher surface tension side located in the outer containment vessel 6.

FIG. 3 illustrates the enhanced Marangoni effect of the processor 2. A semiconductor substrate 8 is illustrated partially submerged in a processing fluid 16 such as Dl water. The delivered dilute organic vapor 40 is schematically illustrated by arrows A. A portion of the organic vapor 40 forms a liquid layer on the surface of the processing fluid 16. Individual molecules of the organic vapor 40 are illustrated schematically by dots 46. As shown in FIG. 3, a higher concentration of liquid organic molecules 46 is found nearest the meniscus 44 on the semiconductor substrate 8. A lower concentration of organic molecules 46 is found in the surface region a of the process vessel 4. An even lower concentration of molecules 46 is found in the meniscus 48 adjacent to the wall 18. A still lower concentration of molecules 46 is found in the meniscus 50 formed on the outer contain vessel 6 side of the processor 2.

As a general matter, the surface tension of the organic liquid layer is lower than the surface tension of DI water. Given the gradient formed along the surface of the DI water 16, a spontaneous flow of fluid in direction of arrow B results consistent with the Marangoni effect. The flow in the direction of arrow B pulls remaining chemicals, particulate matter, organic species, contaminants, and water away from the surface of the semiconductor substrate 8.

Since the wall 18 is porous, remnant chemicals, particulate matter, organic species, and other contaminants are able to flow freely from the surface region of the processing fluid 16 within the process vessel 4, to the fluid located in the outer containment vessel 6. In this regard, chemicals and contaminants do not build-up in the surface region a, in contrast to other rinsing/drying techniques.

While it is preferred that the meniscus 48 on the inside portion of the wall 18, within the process vessel 4, fall at the same rate as the meniscus 50 on the outside portion of wall 18, alternative receding rates can be employed. For example, Dl water 16 can be admitted to the process vessel 4 through the diffuser 28 at a rate lower than the extraction rate of Dl water from the outer containment vessel 6, thus providing for a net flow out of the process vessel 4 via porous walls 18.

During the drying process, i.e., when the DI water 16 or process fluid is removed from the process vessel 4, the surface layer of the Dl water 16 is removed from the process vessel 4 via porous walls 18. The Dl water 16, which contains organic species, remnant chemicals and the like travels outwardly through pores 19 in the wall 18. Preferably, Dl water 16 may be added to the process vessel 4 via the diffuser 28. This maintains an influx of Dl water 16 to replenish and replace the surface layer in the process vessel 4 that is extracted via walls 18. This further assists in preventing the accumulation of organic species in the surface layer a of the Dl water.

In one preferred embodiment, a pressure differential is established between the process vessel 4 and the outer containment vessel 6. In this regard, walls 18 act as a partition separating two different pressure regions. Typically, the pressure is higher in the pressure vessel than in the outer containment vessel 6. In this manner, now is induced from the process vessel 4 to the outer containment vessel 6. The pressure differential can be created by pressurizing a region or area of the processor 2 using a compressor or the like. Alternatively, a source of vacuum (not shown) can be used to establish the pressure differential.

At the end of the rinsing/drying process, when both the outer containment vessel 6 and the process vessel 4 have been evacuated of Dl water 16, the semiconductor substrates 8 are removed from the processor 2. After removal of the semiconductor substrates 8, the outer containment region 6 can be filled with Dl water or other processing fluid 16 to remove any accumulated organic species and other contaminants which have a tendency to clog the pores 19. Fluid flow can be induced in the reverse direction (from the outer containment vessel 6 to the process vessel 4) to clean the pores 19 of the walls 18. This can be done, for example, by establishing a pressure gradient between the process vessel 4 and the outer containment vessel 6.

While Dl water 16 has been described as the preferred processing fluid, other processing fluids 16 can be used. In addition, multiple processing fluids 16 can be introduced to the process vessel 4 through the diffuser 28 in a continuous or near continuous manner. This allows different processing fluids to replace each other. The processing fluid 16 inside the process vessel 4 is removed from the process vessel 4 either by slot drains 20 or through the porous walls 18.

To facilitate the processing of semiconductor substrates 8 with multiple processing fluids 16, the processing fluids 16 can advantageously be introduced through the diffuser 28, causing laminar flow of the processing fluids 16 upward and over the semiconductor substrates 8. The expelled processing fluid 16 can then be returned to a process tank for recovery and reuse. Alternatively, the processing fluid 16 can be directed to a waste drain.

Generally, a processing fluid 16 currently in the process vessel 4 is displaced or removed by another processing fluid 16 or with a rinsing fluid that is introduced through the diffuser 28. This causes the previous processing fluid 16 to move upward and out of the process vessel 4 via slot drains 20 or porous walls 18.

In another separate aspect of the invention, a source of sonic energy 58 is disposed in the process vessel 4. The sonic energy source 58 can emit high frequency sound waves to aid in the cleaning ability of the processor 2. The source of sonic energy 58 can include any number of devices commonly known in the art for emitting high frequency sound waves.

While embodiments of the present invention have been shown and described, various modifications may be made without departing from the scope of the invention. The invention, therefore, should not be limited, except to the following claims, and their equivalents.

What is claimed:

1. A processor for rinsing and drying semiconductor substrates comprising:
    an outer containment vessel;
    a process vessel located inside the outer containment vessel, the process vessel adapted to hold one or more semiconductor substrates stationary therein, the process vessel further including porous walls, wherein the porous walls permit the transfer of fluid from the process vessel to the outer containment vessel.

2. A processor according to claim 1, the process vessel further including one or more slot drains disposed in the porous walls.

3. A processor according to claim 1, the process vessel further including a diffuser located at the underside of the process vessel.

4. A processor according to claim 1, the process vessel having a generally parabolic cross-section.

5. A processor according to claim 1, the process vessel having a pressure different from the pressure of the outer containment vessel.

6. A processor according to claim 5, the process vessel pressure being greater than the outer containment vessel pressure.

7. A processor according to claim 5, the process vessel pressure being less than the outer containment vessel pressure.

8. A processor according to claim 1, further comprising a gas diffuser atop the processing vessel.

9. A processor according to claim 8, the gas diffuser including a plurality of orifices therein.

10. A processor according to claim 1, the porous walls having a substantially uniform thickness.

11. A processor according to claim 1, the porous walls having a substantially uniform porosity.

12. A processor according to claim 1, the porous walls comprising a fluoropolymer.

13. A processor for rinsing and drying a workpiece comprising:
- an outer containment vessel;
- a process vessel within the outer containment vessel, the process vessel having porous walls with movement of fluid through the process vessel walls into the outer containment vessel occurring via a surface tension induced flow created by forces acting across the process vessel walls; and
- a workpiece holder within the process vessel for holding an array of workpieces.

14. The processor of claim 13 further including a workpiece holder within the process vessel for holding the workpiece in a fixed position relative to the process vessel during processing.

15. A processor according to claim 13 wherein the porous walls have a substantially uniform thickness.

16. A processor according to claim 13 wherein the porous walls have a substantially uniform porosity.

17. A processor according to claim 13 wherein the porous walls comprise a fluoropolymer.

18. A processor for rinsing and drying a workpiece comprising:
- an outer containment vessel;
- a process vessel within the outer containment vessel for supporting a workpiece, the process vessel having porous walls that allow movement of fluid through the process vessel walls into the outer containment vessel via a gas pressure differential, with a gas pressure in the process vessel is greater than a gas pressure in the containment vessel.

19. The processor of claim 18 further comprising a compressor in communication with the process vessel for pressurizing the process vessel to establish the pressure differential between the process vessel and the containment vessel.

20. The processor of claim 18 further including a workpiece holder within the process vessel for holding the workpiece in a fixed position relative to the process vessel during processing.

21. A processor according to claim 18 wherein the porous walls have a substantially uniform thickness.

22. A processor according to claim 18 wherein the porous walls have a substantially uniform porosity.

23. A processor according to claim 18 wherein the porous walls comprise a fluoropolymer.

24. A processor for rinsing and drying a workpiece comprising:
- a process vessel having porous walls that allow movement of fluid through the process vessel walls during processing; and
- a workpiece support within the process vessel, with the workpiece support having positions for holding an array of workpieces.

25. A processor for rinsing and drying semiconductor substrates comprising:
- a process vessel adapted to hold one or more semiconductor substrates stationary therein, the process vessel further including porous walls to allow movement of fluid out of the process vessel, and the process vessel including one or more slot drains in the porous walls.

26. A processor for rinsing and drying semiconductor substrates comprising:
- a process vessel adapted to hold one or more semiconductor substrates stationary therein, the process vessel further including porous walls to allow movement of fluid out of the process vessel; and
- a gas diffuser on the top of the processing vessel.

27. A processor for rinsing and drying a workpiece comprising:
- a process vessel having porous walls that allow movement of fluid through the process vessel walls via a gas pressure differential; and
- a gas compressor in communication with the process vessel for pressurizing the process vessel.

28. A processor for rinsing and drying a workpiece comprising:
- a process vessel having porous walls that allow movement of fluid through the process vessel walls during processing;
- a workpiece holder in the process vessel, for holding workpieces; and
- one or more drains through the walls of the process vessel, at a position vertically higher than the workpiece holder.

29. The processor of claim 24 further comprising a containment vessel, with the process vessel positioned within the containment vessel.

* * * * *